(12) United States Patent
Demone

(10) Patent No.: US 7,269,075 B2
(45) Date of Patent: Sep. 11, 2007

(54) METHOD AND APPARATUS FOR SIMULTANEOUS DIFFERENTIAL DATA SENSING AND CAPTURE IN A HIGH SPEED MEMORY

(75) Inventor: Paul Demone, Kanata (CA)

(73) Assignee: Mosaid Technologies Incorporated, Kanata, Ontario (CA)

( * ) Notice: Subject to any disclaimer, the term of this patent is extended or adjusted under 35 U.S.C. 154(b) by 579 days.

(21) Appl. No.: 10/337,346

(22) Filed: Jan. 7, 2003

(65) Prior Publication Data
US 2003/0156461 A1 Aug. 21, 2003

Related U.S. Application Data

(63) Continuation of application No. PCT/CA00/00879, filed on Jul. 31, 2000.

(30) Foreign Application Priority Data
Jul. 7, 2000 (CA) .................................. 2313948

(51) Int. Cl.
*G11C 7/10* (2006.01)
(52) U.S. Cl. .................. 365/189.05; 365/190; 365/205
(58) Field of Classification Search ........... 365/189.05, 365/205, 190, 233
See application file for complete search history.

(56) References Cited

U.S. PATENT DOCUMENTS

| | | | | |
|---|---|---|---|---|
| 5,297,092 A | * | 3/1994 | Johnson | 365/203 |
| 5,452,239 A | | 9/1995 | Dai et al. | |
| 5,485,430 A | * | 1/1996 | McClure | 365/233 |
| 5,959,899 A | | 9/1999 | Sredanovic | 365/189.02 |
| 5,977,798 A | | 11/1999 | Zerbe | 326/98 |
| 6,201,418 B1 | * | 3/2001 | Allmon | 327/52 |

* cited by examiner

*Primary Examiner*—Son L. Mai
(74) *Attorney, Agent, or Firm*—Anne Kinsman; Borden Ladner Gervais LLP

(57) ABSTRACT

A differential data sensing and capture circuit, includes a differential input stage circuit for receiving respective ones of said differential data signals and having first and second output nodes. A latch element is provided, having first and second complementary inputs coupled to receive signals from said respective first and second output nodes. A gating circuit dynamically enables and disables a clock signal to the differential input stage in response to an enable signal, such that power consumption in said differential input stage is conserved. In a further embodiment the enable signal is a complementary clock input signal.

5 Claims, 8 Drawing Sheets

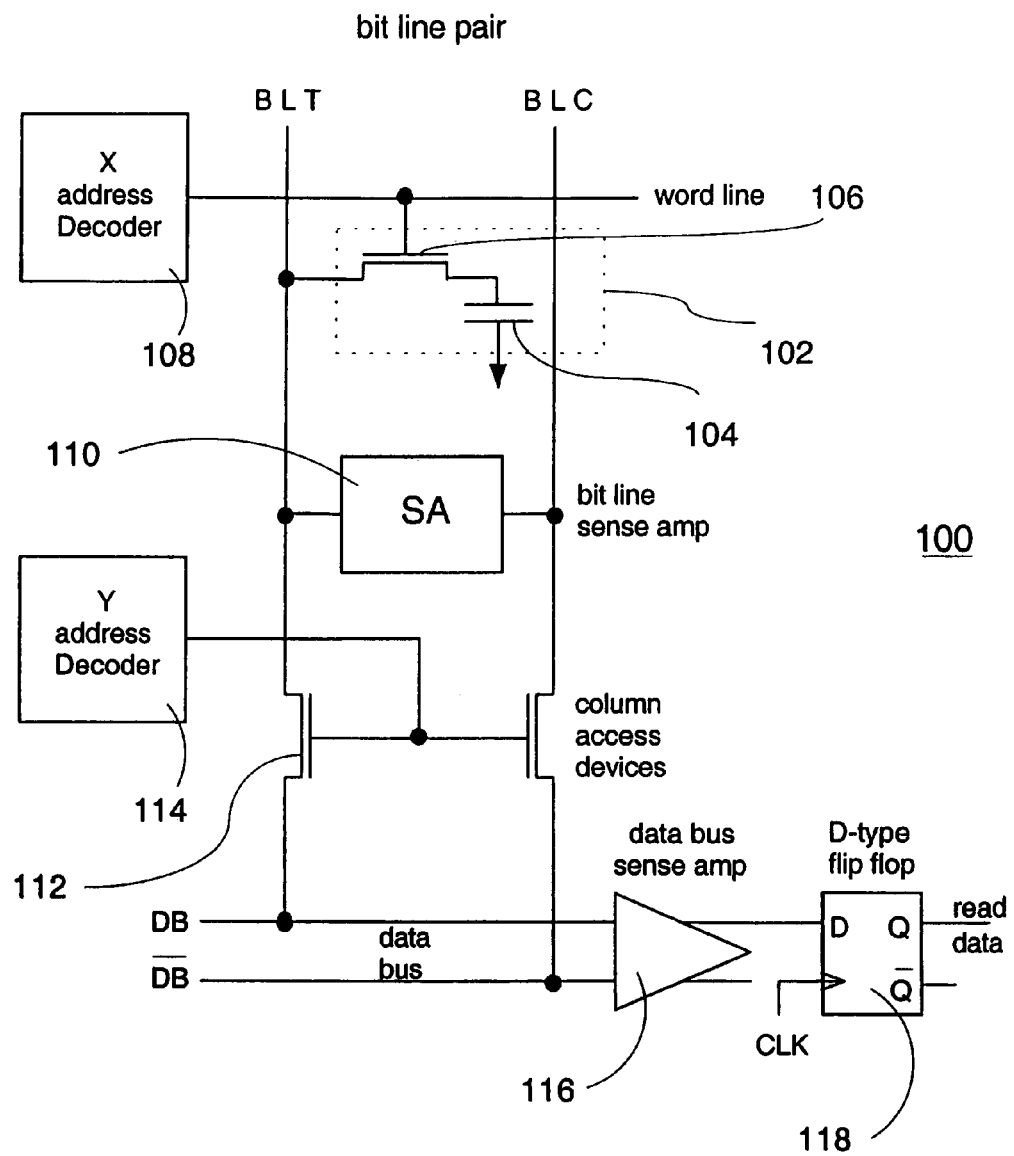
Figure 1a - PRIOR ART

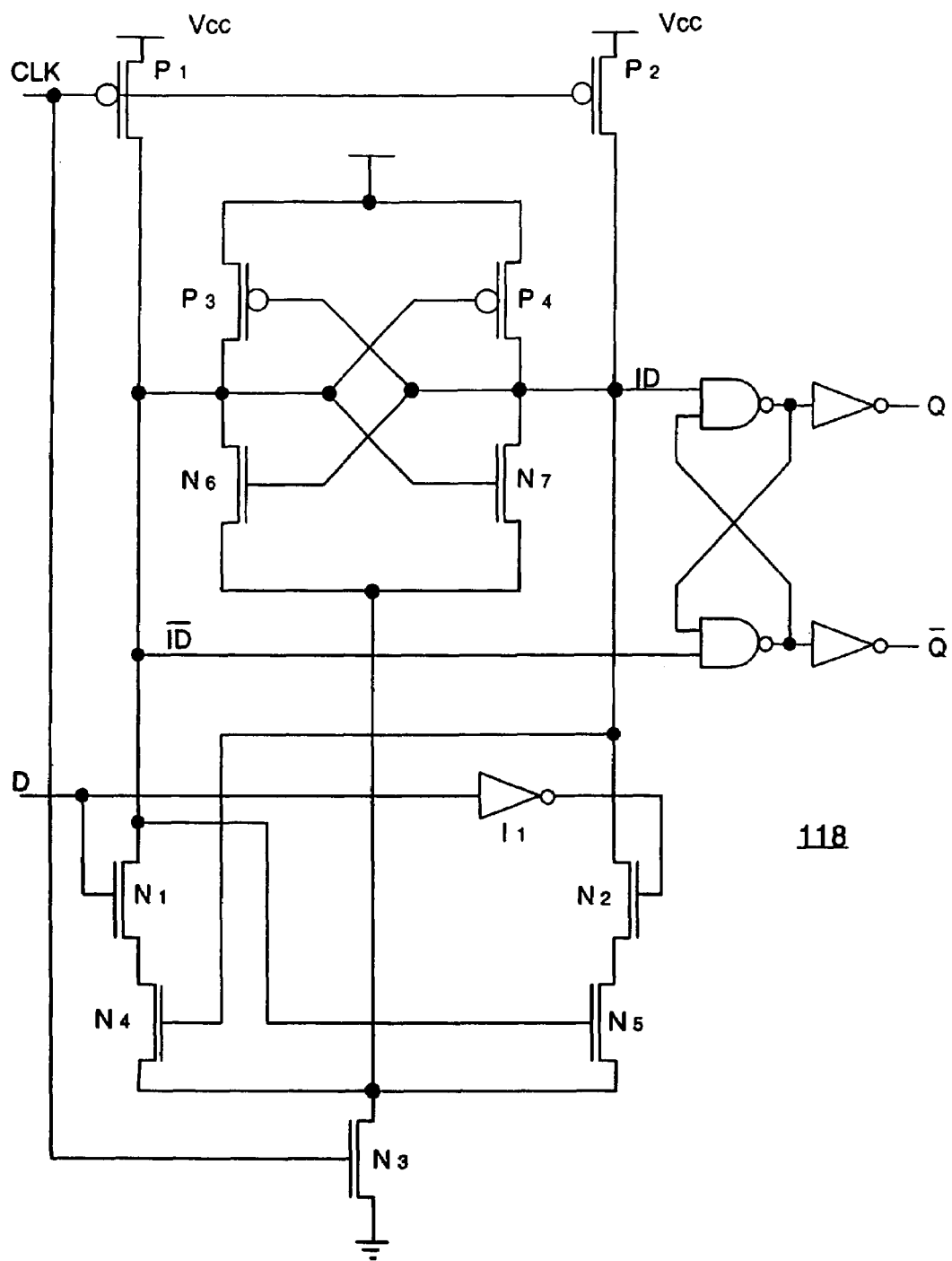
Figure 2 - PRIOR ART

METHOD AND APPARATUS FOR SIMULTANEOUS DIFFERENTIAL DATA SENSING AND CAPTURE IN A HIGH SPEED MEMORY

This application is a Continuation Application from International Application No. PCT/CA00/00879, filed Jul. 31, 2000, which claims priority from Canadian Application Ser. No. 2,313,948, filed Jul. 7, 2000.

The present invention relates to the field of semiconductor memories, and more particularly, to a system and method for reducing read operation path delays in high-speed memories.

BACKGROUND OF THE INVENTION

In semiconductor memories, Read data, which is sensed and restored on the bitlines of a memory array, are typically transported to output pins or pads of the semiconductor memory via long data bus lines. The bus lines are connected to the bitlines through column access devices. These column access devices are usually n-channel pass transistors. Reduction of the delay in propagating read data from the bitline to the data bus is limited by the low drive capabilities of the column access device and the heavy capacitive load of the data bus trace. The column access device size and drive is constrained by several factors. The first is the need to prevent an excessive capacitive burden on the bitlines especially in the case of DRAMs where bitline capacitance is a constraint on the speed of sensing. The second, is the need to eliminate the chance of the sense amplifier being flipped due to an incorrect state when attempting to read data whose value is a complementary value to the initial state of the data bus prior to the enabling of the column access device.

To avoid excessive read latency due to slow voltage transitions on the data bus lines, it is typical for the data bus lines to be grouped into complementary pairs that are connected to respective complementary bitline pairs through respective column access devices. The voltage differential on the data bus pair due to data readout from the associated bitline pair is amplified by a differential amplifier (the data bus sense amplifier). In a memory with a synchronous interface the amplified read data is typically latched by a single ended input D-type flip-flop before it is transmitted to the output pin or pad as shown in FIG. 1(a). A drawback of this approach is that the sequential nature of the read process and the serial timing required by the traditional approach of using a differential amplifier interposed between a data bus pair DB and $\overline{DB}$ and a single ended input flip-flop adds unnecessary delay to read operations which can limit the cycle time. It is thus desirable to speed up the memory Read operation.

SUMMARY OF THE INVENTION

The present invention seeks to solve the problem of unnecessary delay in the Read operation of a synchronous semiconductor memory.

An advantage of the present invention is a circuit element that combines the differential signal amplification of a traditional data bus sense amplifier with the data capture function of a D-type flip-flop.

A further advantage of the invention is to reduce unnecessary power consumption during non-read periods.

In accordance with this invention there is provided a differential data sensing and capture circuit, comprising:

(a) a differential input stage circuit for receiving respective ones of said differential data signals and having first and second output nodes;
(b) a latch element having first and second complementary inputs coupled to receive signals from said respective first and second output nodes; and
(c) a gating circuit for dynamically enabling and disabling a clock signal to said differential input stage in response to an enable signal, such that power consumption in said differential input stage is conserved.

BRIEF DESCRIPTION OF THE DRAWINGS

These and other features of the preferred embodiments of the invention will become more apparent in the following detailed description in which reference is made to the appended drawings wherein:

FIG. 1(a) is a schematic diagram of a data sensing and capture circuit according to the prior art;

FIG. 2 is a schematic diagram of a single input D type flip-flop;

DETAILED DESCRIPTION OF THE PREFERRED EMBODIMENTS

Figure 1B:
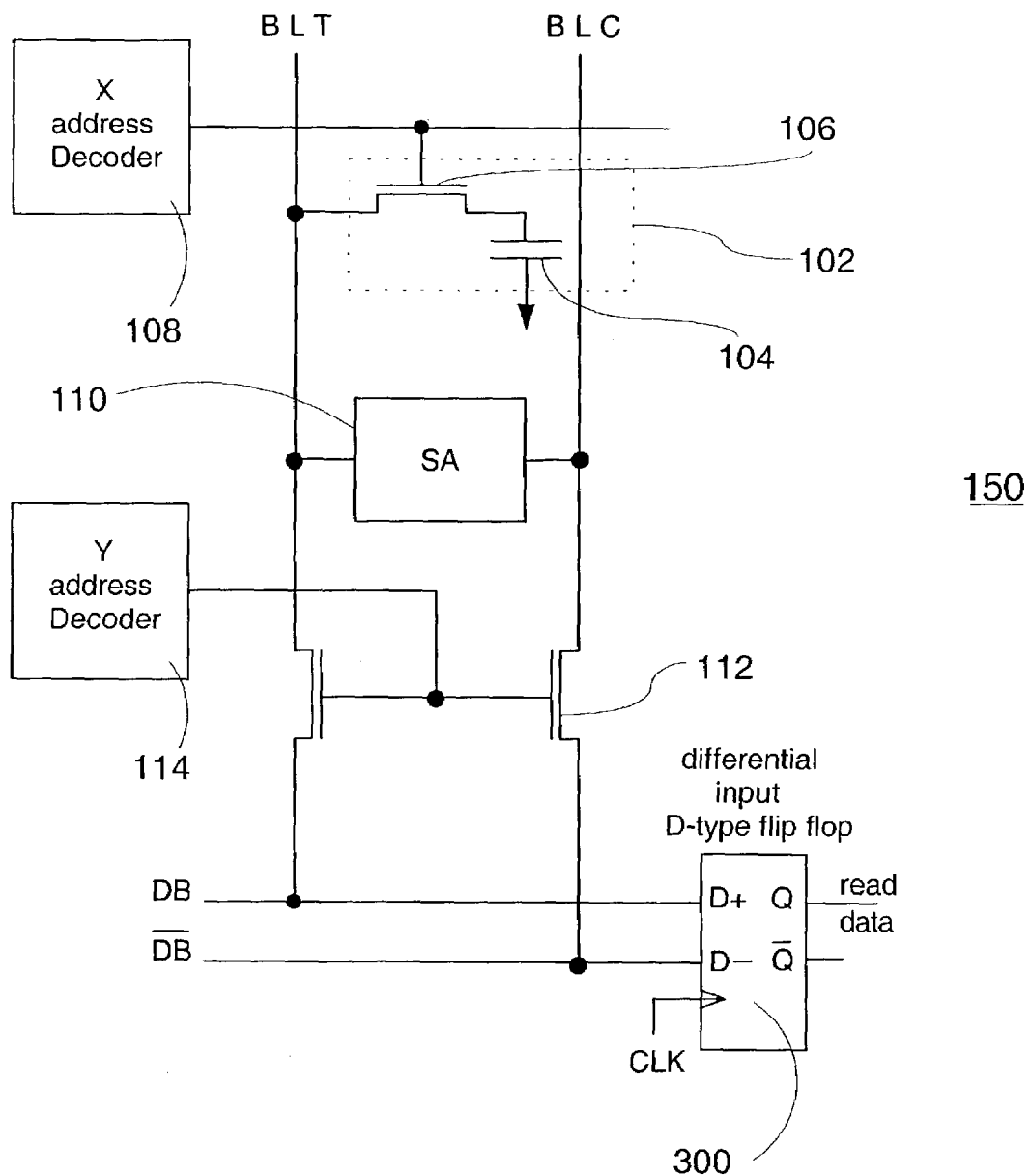
FIG. 1(b) is a schematic diagram of a data sensing and capture circuit according to the present invention.

In the following description, like numerals refer to like structures in the drawings. Referring to FIG. 1A there is shown a schematic diagram of part of a data output circuit 100 for a semiconductor memory according to the prior art. The output circuit includes memory cells 102 comprised of a storage capacitor 104 coupled to a bitline BLT via an access transistor 106. The access transistors 106 have their gates coupled along wordlines that are activated by signals generated by an X address decoder 108. Bit line sense amplifiers 110 are coupled between complementary pairs of bitlines. Columns of memory cells 102 or bitlines are coupled to data bus lines DB and $\overline{DB}$ via respective column access devices 112. The column access devices 112 are normally activated by signals from an Y address decoder 114. A differential input data bus sense amplifier 116, the output of which drives a single input D-type flip-flop 118, senses the data bus lines DB and $\overline{DB}$. The flip-flop 118 has its Q output coupled to a Read data output line. The data bus sense amplifier senses the data in the lines, which is then latched by clocking the flip-flop 118.

Referring to FIG. 1B, there is shown a data output circuit 150 according to an embodiment of the present invention. In this circuit arrangement, rather than having a separate data bus sense amplifier 116 and a single input D-type flip-flop 118 as shown in FIG. 1A, there is provided a single differential input D-type flip flop 300 having differential inputs D+ and D− coupled directly to the data bus lines DB and $\overline{DB}$. The flip-flop 300 reduces unnecessary Read operation delays and improves power consumption during idle (non-read) periods. A detailed description of the flip-flop 300 follows.

Referring to FIG. 2, there is shown a schematic diagram of a traditional D type flip-flop 118 of the type shown in FIG. 1A. The flip-flop circuit 118 has a single D input, a clock input CLK, and a pair of complimentary outputs Q and $\overline{Q}$. As shown in FIG. 1A, this D type flip-flop 118 is normally connected to the output of the data bus sense amplifier 116 and has one of its outputs connected to the read data path as shown schematically in FIG. 1A. The disadvantages of this circuit arrangement are discussed in the background of the invention. The flip-flop 118 has a data input circuit comprised of a pair of cross-coupled n-channel transistors N4 and N5, the sources of which are coupled through an n-channel transistor N3 to ground. The drains of the respective cross-coupled transistors N4 and N5 are coupled to respective input transistors N1 and N2 which in-turn couple the transistors N4 and N5 through respective p-channel transistors P1 and P2 to the supply voltage Vcc. The D input is coupled to the gate of transistor N1 while an inverted version of the D input is coupled to the gate of transistor N2 via an inverter I1. While this circuit 118 is suitable for a single input, it has to be modified for differential data inputs.

Figure 3A:
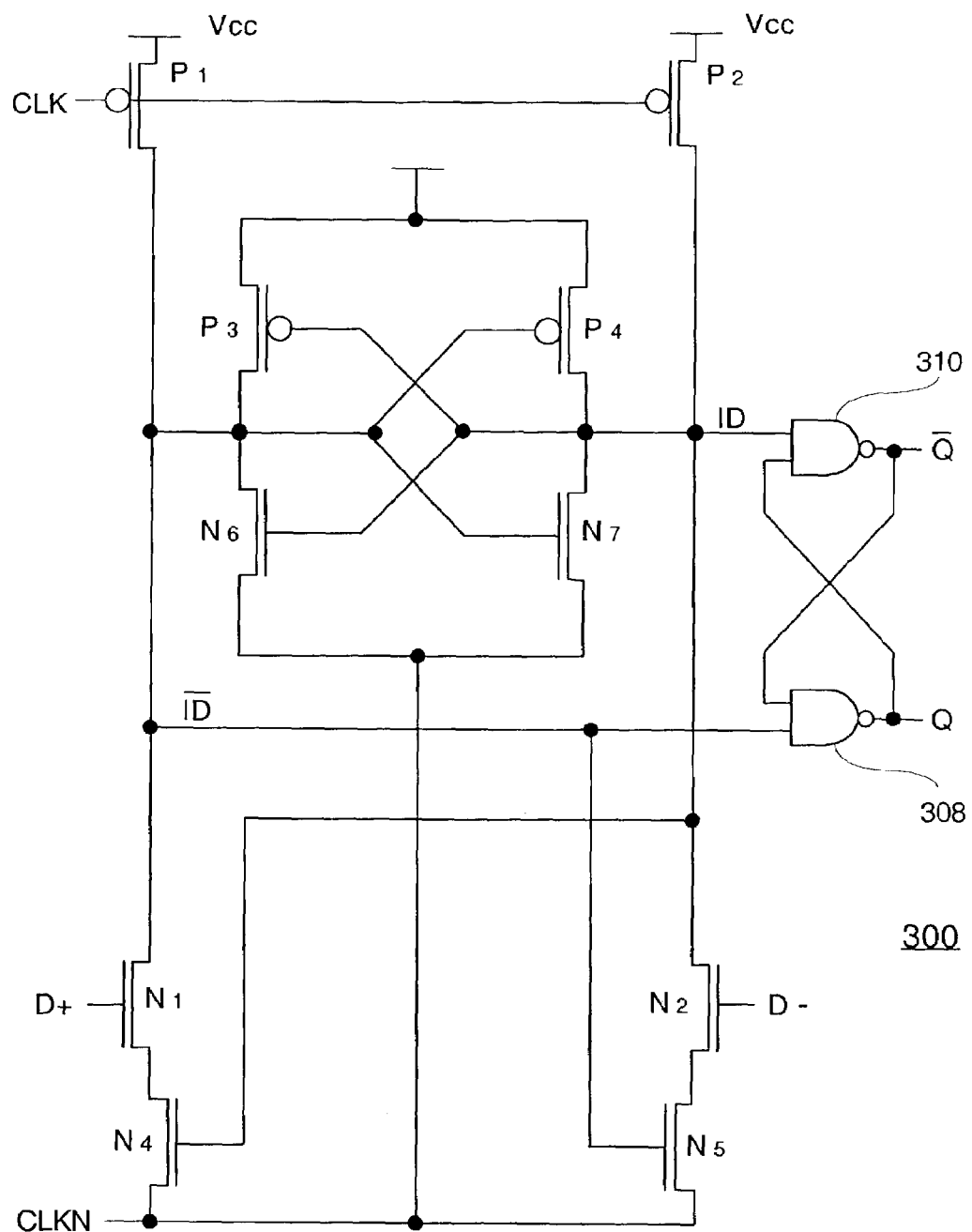
FIG. 3(a) is a schematic diagram of a differential input flip-flop circuit according to an embodiment of the present invention.

Accordingly, referring to FIG. 3A, there is shown a flip-flop circuit 300 adapted for differential data input, according to an embodiment of the present invention. As in the flip-flop 118, the flip-flop 300 also has a data input circuit comprised of a pair of cross-coupled n-channel transistors N4 and N5, the sources of which are coupled through an n-channel transistor N3 to ground. The drains of the respective cross-coupled transistors N4 and N5 are coupled to respective input transistors N1 and N2 which in-turn couple the transistors N4 and N5 through respective p-channel transistors P1 and P2 to the supply voltage Vcc. A latch type amplifier circuit is coupled to nodes ID and $\overline{ID}$ formed around p-channel transistors P3, P4, n-channel transistors N6, N7 and cross-coupled NAND gates 308 and 310. In the circuit 300, instead of having inverter I1 in FIG. 2 provide the input to transistor N2, the second differential input D− is provided directly to the gate of transistor N2. Thus, the complimentary data inputs are now shown as D+ and D− coupled to respective gates of transistors N1 and N2. Furthermore, transistor N3 was removed and a complementary version CLKN of the clock input CLK was added to provide ground supply voltage during the time that the clock input CLK is logic '1'; this is accomplished by connecting the CLKN signal to the drains of pull down transistors N4 and N5. Thus, to reduce unnecessary power consumption, the clock input allows gating of the differential flip flop 300 for disabling it when read operations are not being performed. This modification also limits negative impact on clock-to-read-data output timing of the memory.

Figure 3B:
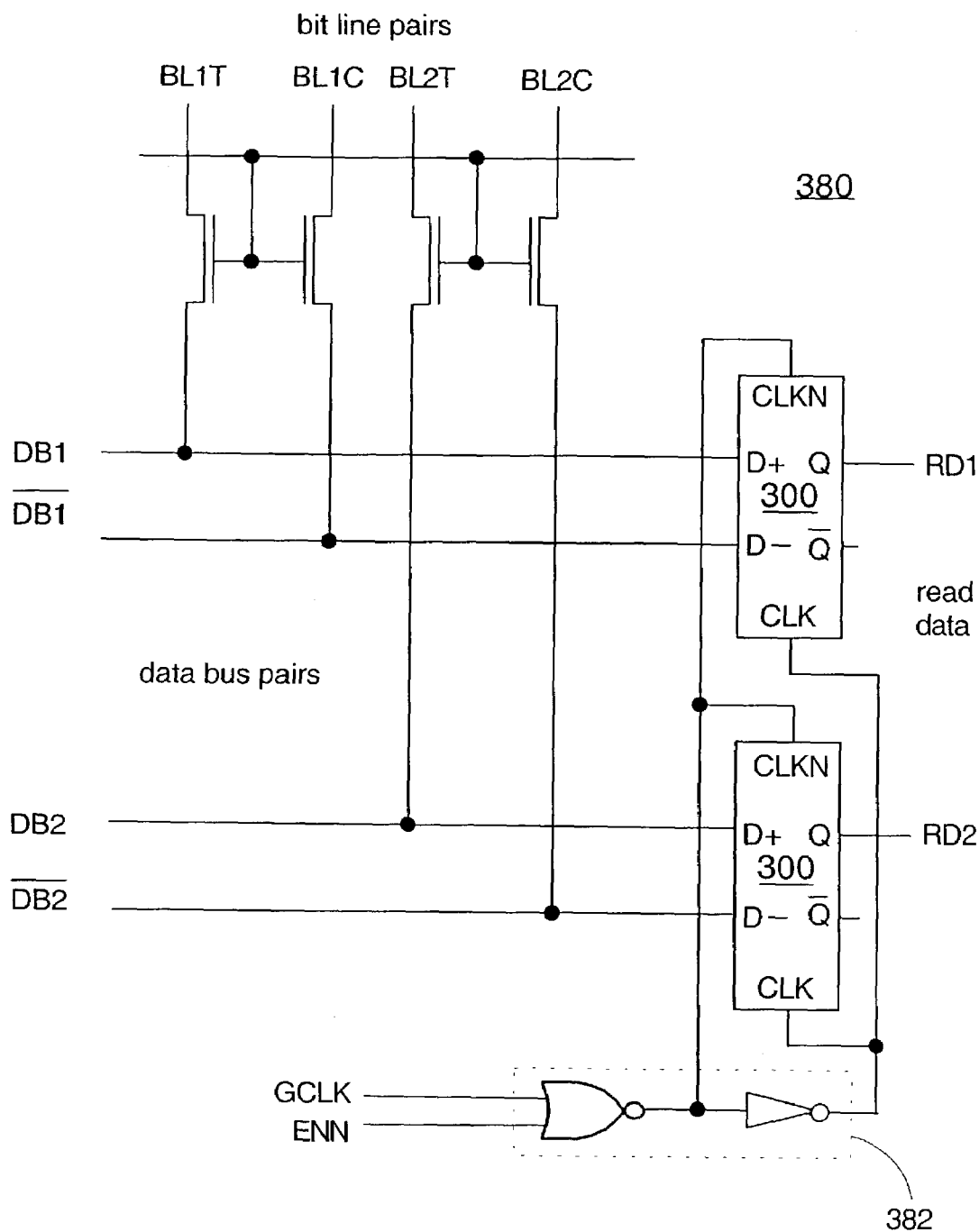
FIG. 3(b) is a schematic diagram of a clock gating circuit according to the present invention.

Referring now to FIG. 3B, there is shown a schematic diagram 380 of two differential input D type flip flops 300 coupled to data bus pairs in a memory, according to an embodiment of the present invention. As shown in this circuit configuration 380, a clock gating circuit 382 comprises a two input NOR gate having a gating clock GCLK input and an enable input ENN. The output of the NOR gate is coupled to the CLKN inputs of the differential input flip flops 300 (which as shown in FIG. 3A is provided to the drains of transistors N4 and N5) and an inverted version of the output is connected to the CLK inputs of the flip flops 300 (which as shown in FIG. 3A is provided to the gates of transistors P1 and P2). As shown therefore, the clock gating circuit 382 selectively enables the flip flops 300 to accept differential input data and provide single ended read data outputs RD1 and RD2.

Figure 4:
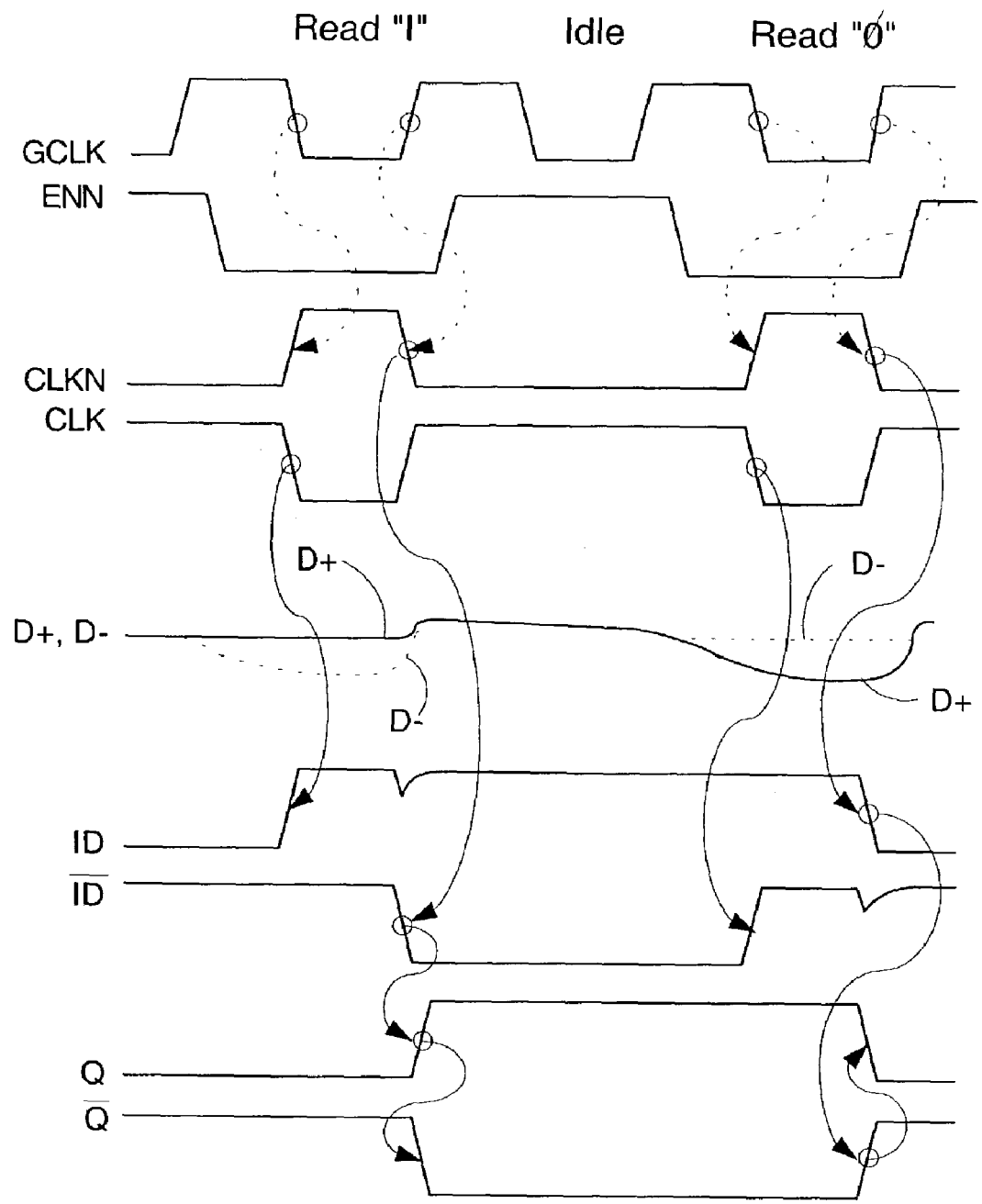
FIG. 4 is a diagram of the timing waveforms for the circuit of FIG. 3(B)

Referring now to FIG. 4, there is shown the timing waveforms associated with the operation of a clock gating circuitry 382 and the differential input flip flops 300. As may be seen, three illustrative periods of the GCLK clock signal comprise a "read 0" followed by an "idle" followed by a "read 1" operations, although this sequence is not required in order to implement the invention. During the read operations, the active low enable signal ENN signal is low, thereby enabling the NOR gate in the clock gating circuit 382. With the NOR gate enabled, on the subsequent falling edge of the GCLK, the output of the NOR gate generates the CLKN pulse and the output of the inverter of clock gating circuit 382 generates the CLK pulse. With the CLK pulse being low, transistors P1 and P2 in FIG. 3A are turned on and precharge the ID and $\overline{ID0}$ signals both high while the input stage comprising transistors N1, N2, N4, N5 is disabled since CLKN is high. With a differential voltage developed on the complementary data bus pairs, the differential inputs D+ and D− are sensed and latched by flip flop 300 on the falling edge of CLKN, generating Q and $\overline{Q}$ outputs. The "idle" cycle maintains ENN high, thereby disabling the clock gating circuit 382 and maintaining the same outputs on Q and $\overline{Q}$. When reading a "0" during the third cycle, the ENN signal is once again asserted thereby enabling the clock gating circuit 382. Similar to the case of reading a "1", the falling edge of the CLK signal precharges both the ID and the $\overline{ID}$ signals high. The falling edge of the CLKN signal then senses and latches the differential data which in turn generates the Q and $\overline{Q}$ outputs of the flip flop 300. Accordingly, the differential input flip-flops 300 reduce unnecessary power consumption by gating the clock input to the differential flip-flop and disabling it when reading operations are not being performed.

Figure 5:
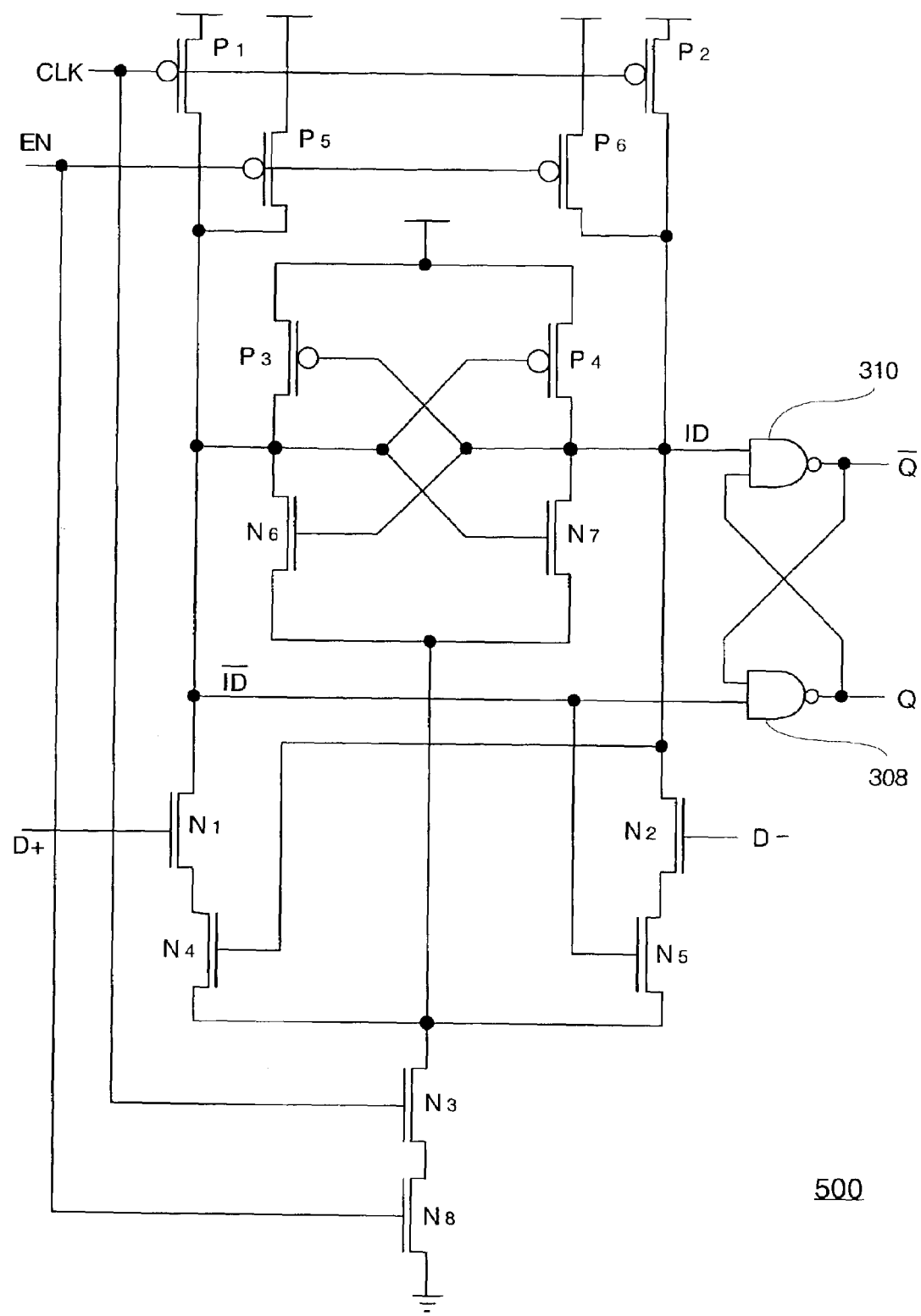
FIG. 5 is a schematic diagram of a further embodiment of the present invention.

Referring to FIG. 5, there is shown another embodiment of the differential input flip flop circuit 300 that supports limited dynamic power management without external clock gating circuitry or a complimentary clock input. In the circuit 500, a pair of P channel devices is controlled by an enable signal and an additional transistor N8 is connected to a transistor N3 that is also driven by the enable signal. Thus, in this circuit 500, the CLKN signal is not used.

Figure 6A:
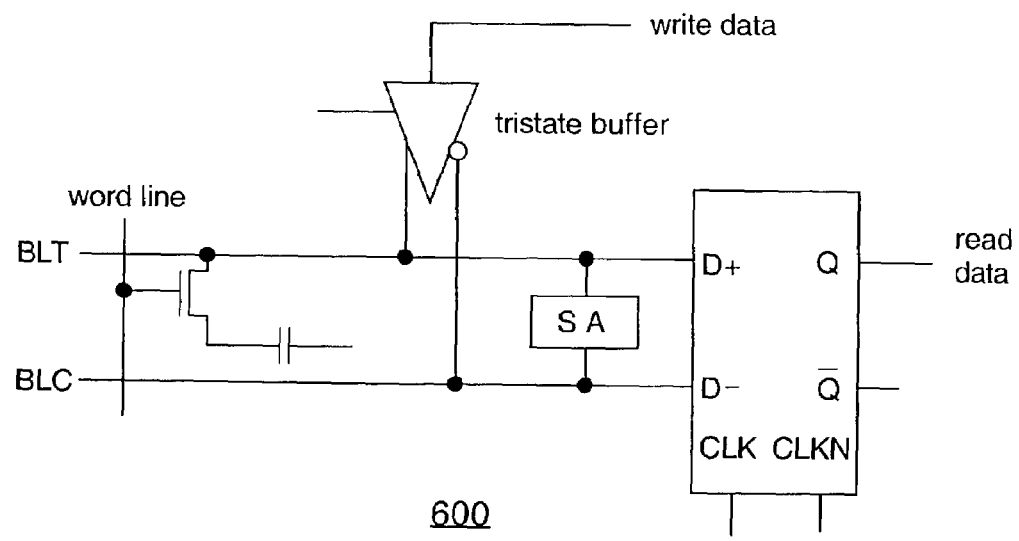
FIGS. 6(a) and 6(b) are schematic diagrams of further embodiments of the present invention.
Figure 6B:
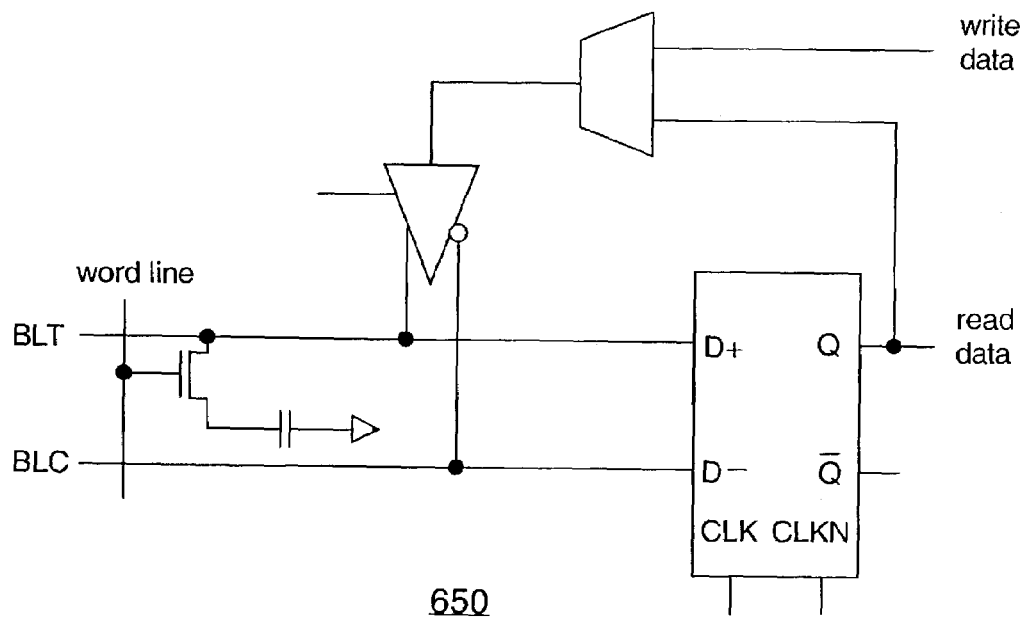

Referring to FIGS. 6A and 6B, there is shown a still further embodiment of the invention as applied to short bit line DRAM arrays. In this arrangement, the differential input flip flops 300 are coupled to the bit lines to directly sense and capture memory cell read out for voltage levels. This configuration is best suited for small memory arrays where layout rules allow the fitting of the flip flop circuits within the bitline pitch or having the flip flop circuits staggered to fit within the bitline pitch. This would allow for a very fast circuit implementation since all the control and timing circuits associated with the data bus sensing and latching would be omitted. In FIG. 6A, the differential input flip flop 300 is shown connected in conjunction with a conventional bit line sense amplifier and in FIG. 6B the differential input flip flop 300 is shown as a replacement for a conventional bit line sense amplifier. It may be noted that in the configuration shown in FIG. 6B, the data captured by the circuit would have to be written back (either using the normal write operation circuitry or special purpose restoration circuitry) to restore memory cell voltage levels. When the differential input flip flop is used in conjunction with a conventional sense amplifier as shown in FIG. 6A, the circuit allows read data to be captured prior to or in the process of restoration of full swing voltage levels on the bit line pair by the conventional sense amplifier.

The invention can be applied to other situations where long pairs of wires are used to transmit data either differentially or dual rail within synchronous systems. This may include high performance synchronous SRAMs, other types of electronic memories with registered outputs, and long, heavily loaded differential or dual rail data buses within the datapaths of digital signal processors and microprocessors.

Although the invention has been described with reference to certain specific embodiments, various modifications thereof will be apparent to those skilled in the art without departing from the spirit and scope of the invention as outlined in the claims appended hereto.

The embodiments of the invention in which an exclusive property or privilege is claimed are defined as follows:

1. A differential input latch for use in a Dynamic Random Access memory (DRAM), comprising:
   a) a differential input stage circuit for receiving a pair of differential input data signals to generate a pair of output signals at a respective first and second nodes;
   b) an amplifying element for amplifying said output signals at said first and second nodes;
   c) a latch element for at least temporarily storing said respective amplified output signals at said first and second output nodes; and,
   d) a circuitry for dynamically enabling and disabling said differential input stage in response to an enable signal and a clock signal.

2. A method for differential data sensing and capture in a Dynamic Random Access Memory (DRAM), comprising the steps of:
   a) receiving a pair of differential input signals at a differential input stage circuit, said differential input stage having first and second output nodes;
   b) amplifying the signals at said first and second output nodes;
   c) temporarily storing said first and second output nodes in a latch element having first and second complimentary latch inputs; and,
   d) selectively enabling and disabling said differential input stage in response to an enable signal and a clock signal.

3. The differential input latch as claimed in claim 1, said differential input stage circuit comprising a pair of cross-coupled N-channel transistors, having their sources coupled to a clock input signal and their drains coupled to respective n-channel transistors for receiving said respective ones of said input data signals.

4. The differential input latch as claimed in claim 1, wherein said latch element comprises a pair of cross-coupled NAND gates.

5. A differential input latch for use in a Dynamic Random Access memory (DRAM), comprising:
   a) a differential input stage circuit for receiving respective ones of a pair of differential input data signals to generate a pair of output signals at respective first and second nodes, indicative of a difference between said pair of differential input data signals;
   b) an amplifying element for amplifying said output signals at said first and second nodes;
   c) a latch element for latching said respective amplified output signals at said first and second nodes; and
   d) a first and second input nodes associated with said differential input stage for dynamically enabling and disabling said differential input stage in response to an enable signal and a clock signal.

* * * * *